United States Patent [19]

Itoh et al.

[11] 4,247,921

[45] Jan. 27, 1981

[54] DECODER

[75] Inventors: Hideo Itoh; Kenji Agatsuma; Eiji Noguchi, all of Kawasaki, Japan

[73] Assignee: Fujitsu Limited, Japan

[21] Appl. No.: 62,487

[22] Filed: Jul. 31, 1979

[30] Foreign Application Priority Data

Jul. 31, 1978 [JP] Japan .................................. 53-93502

[51] Int. Cl.³ .................... G11C 7/00; G11C 11/40
[52] U.S. Cl. ................................ 365/233; 365/189; 307/238
[58] Field of Search ............... 365/189, 233, 174, 182; 307/238

[56] References Cited

U.S. PATENT DOCUMENTS 4,110,842  8/1978  Sarkissian ........................... 365/233

Primary Examiner—Terrell W. Fears
Attorney, Agent, or Firm—Staas & Halsey

[57] ABSTRACT

A decoder for decoding address signals and a clock signal, in a synchronous CMOS memory, comprising an MOS transistor of one conductivity-type, to whose gate is applied a clock-including address signal, and a plurality of MOS transistors of the opposite conductivity-type connected in series, to each gate of which is applied the address signal and the clock-including address signal, respectively, whereby a terminal connecting the MOS transistor of one conductivity-type and the MOS transistors of the opposite conductivity-type serves as an output.

10 Claims, 15 Drawing Figures

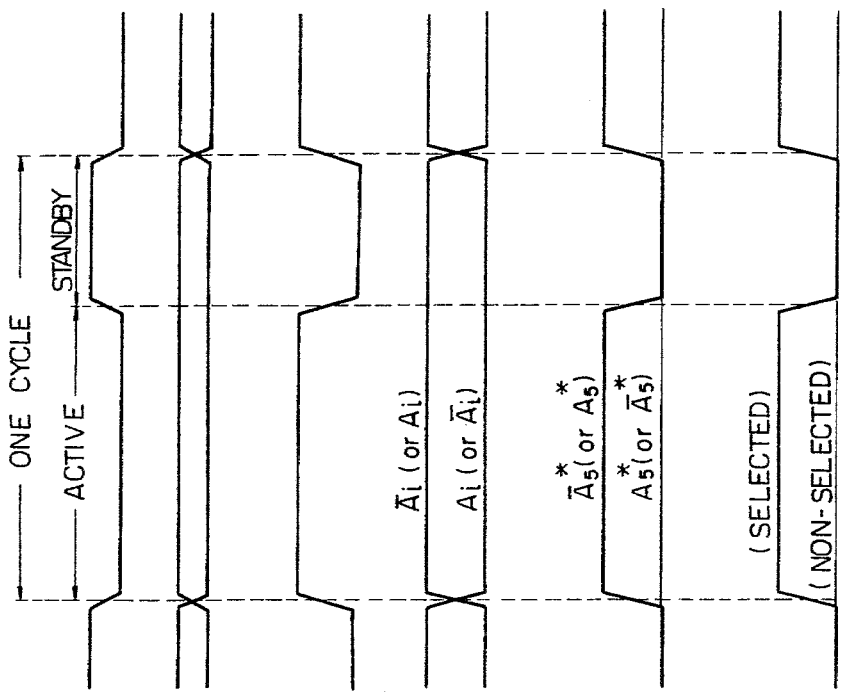

ial of the decoder. For example, when the
DECODER

BACKGROUND OF THE INVENTION

1. Field of the Invention

This invention relates generally to a decoder and, more particularly, to a decoder for decoding address signals and a clock signal in a synchronous complementary metal-oxide-semiconductor memory (hereinafter referred to as a CMOS memory).

2. Description of the Prior Art

In recent years, large scale integrated circuits (hereinafter referred to as LSI) such as a random access memory (hereinafter referred to as RAM) or a read only memory (hereinafter referred to as ROM) have been manufactured by using CMOS technology. CMOS technology has a number of well known advantages, including low power consumption, wide voltage operating range, wide temperature operating range, and good noise immunity. The selection of a memory cell within the memory can be carried out by decoding address signals, on address lines which designate the location of the cell. Thus, after a desired cell is selected, the data stored in the cell is read out or new data is written into the cell.

While a row-address signal, in the row address lines is decoded by a group of row decoders, whose number is the same as that of the rows, a column-address signal in the column address lines is decoded by a group of column decoders, whose number is the same as that of the columns. These decoders associated with the memory cells are manufactured on a chip. Therefore, it is necessary to reduce the area of each of the decoders on the chip in order to obtain high integration of the memory chip.

A decoder used in a prior art asynchronous CMOS memory includes an MOS transistor of one conductivity-type, such as a p-channel MOS transistor to whose gate is applied an address signal and a plurality of MOS transistors of the opposite condutivity-type, such as n-channel MOS transistors, connected in series and having gates to which predetermined address signals are applied. The connecting point of the p-channel MOS transistor and the series-connected n-channel MOS transistors serves as an intermediate output terminal of the decoder (Ref.: IEEE JOURNAL OF SOLID-STATE CIRCUITS, Vol. SC-12, No. 5, Oct., 1977, pp. 502-506). For example, when the p-channel MOS transistor is non-conductive and all the n-channel MOS transistors are conductive, the decoder can select its corresponding row or column. However, in a memory decoded by using a plurality of the above-mentioned decoders, one memory cell is selected no matter what the address signal in the address lines may be. As a result, even during an operation in which no reading is involved, load transistors which are arranged in the bit lines at the selected memory cell are conductive, so that the data stored in the cell may be read out. The power consumption during such an operation is large. Therefore, it is necessary to eliminate the above-mentioned power consumption.

A prior art row decoder or column decoder used for a synchronous CMOS memory receives row-address signals or column-address signals, as well as a clock signal for disabling the entire chip of the memory, thereby eliminating the power consumption due to the useless reading-out operation. For example, the row decoder includes an MOS transistor of one conductivity-type, such as a p-channel MOS transistor, to whose gate is applied the clock signal, and a plurality of MOS transistors of the opposite conductivity-type, such as n-channel MOS transistors, connected in series. The clock signal is applied to the gate of one of the n-channel MOS transistors and each of the row-address signals is applied to the gates of the other n-channel MOS transistors, respectively. The connecting point of the p-channel MOS transistor and the series-connected n-channel MOS transistors serves as an intermediate output terminal of the decoder. For example, when the p-channel MOS transistor is non-conductive and all the n-channel MOS transistors are conductive, which means that the potential of the clock signal is high, the decoder can select its corresponding row. There are many row and column decoders in a chip. For example, there are 32, 64 and 128 row decoders in the 1K(32×32), 4K(64×64) and 16K(128×128) bit memory chips, respectively. Therefore, it is necessary to reduce the number of elements included in the decoders such as row decoders, in order to obtain high-density integration of the memory chip.

SUMMARY OF THE INVENTION

It is a principal object of the present invention to provide a decoder, used in a synchronous CMOS memory, formed by a small number of elements, such as MOS transistors, so that the area occupied by all the decoders in a chip is small and high-density integration of a memory may be attained.

It is another object of the present invention to provide a decoder used in a synchronous CMOS memory, which disables half of the decoders in a chip, even in a "no stand-by state", wherein the potential level of the clock signal is high, and as a result, the possibility of accessing non-selected memory cells is small.

According to the present invention, there is provided a decoder for decoding address signals and a clock signal, in a sychronous CMOS memory. The decoder comprises an MOS transistor of one conductivity-type, such as a p-channel MOS transistor, to whose gate is applied a clock-including address signal, defined as a logical product of one of the address signals and the clock signal, and a plurality of MOS transistors of the opposite conductivity-type, such as n-channel MOS transistors, connected in series, to each gate of which is applied the remainder of the address signals and the clock-including address signal, respectively. As a result, a terminal connecting the p-channel MOS transitor and the series-connected n-channel MOS transistors serves as an intermediate output terminal of the decoder. In the memory decoded by such decoders, one half of the memory cells are stably disabled even when the potential of the clock signal is high.

The present invention will be more clearly understood from the following description with reference to the accompanying drawings.

BRIEF DESCRIPTION OF THE DRAWINGS

FIG. 6b is a circuit diagram illustrating the address buffer of FIG. 6a;

FIG. 8a through 8f are timing diagrams showing the signals appearing in the address buffers of FIGS. 6a and 7a and the decoder of FIG. 5.

DESCRIPTION OF THE PREFERRED EMBODIMENT

Figure 1:
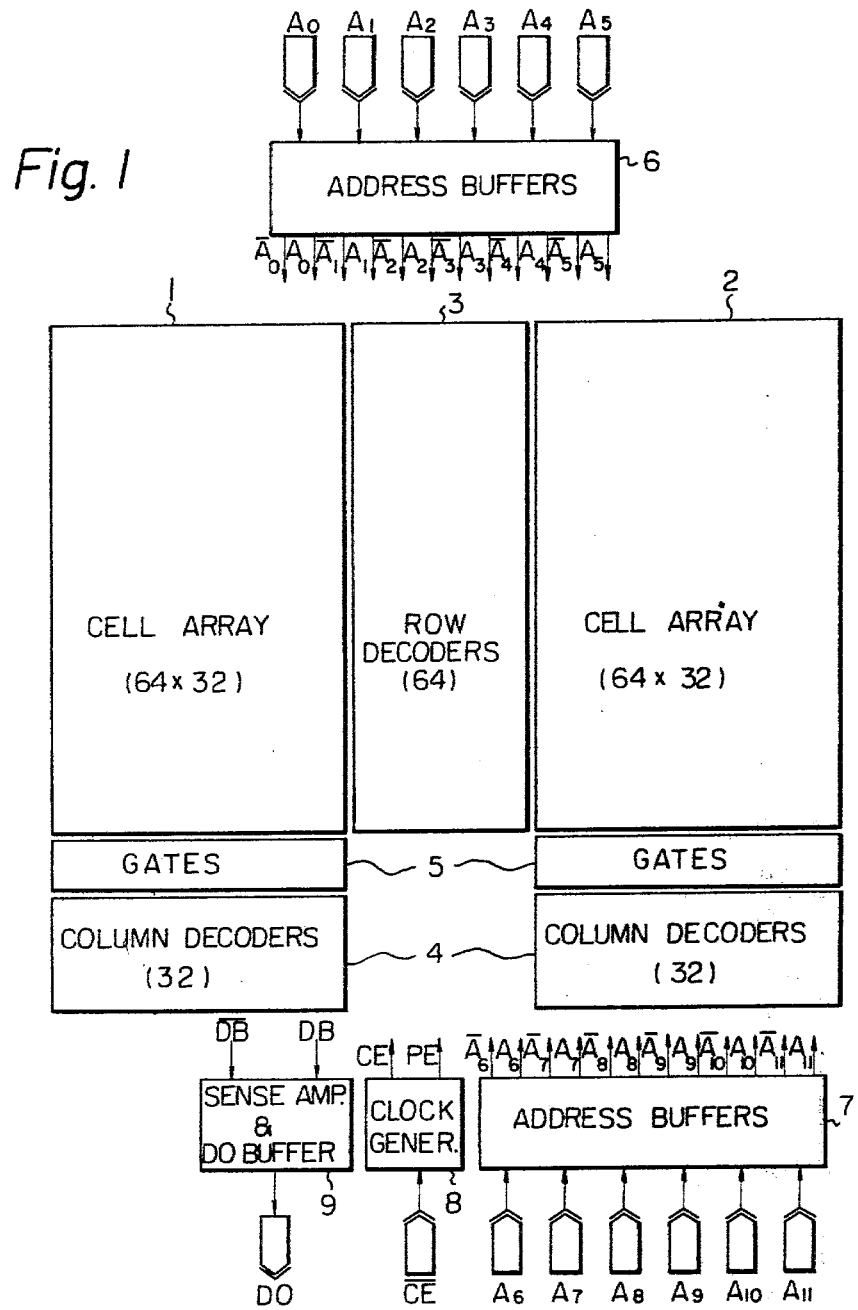
FIG. 1 is a layout diagram illustrating a general synchronous CMOS memory.

FIG. 1 is a layout diagram illustrating a general synchronous CMOS memory which is, for example, a 4096 bit RAM or ROM. The memory includes two cell arrays 1 and 2, each of which is composed of 2048 memory cells (64 rows×32 columns), a group 3 of row decoders for decoding row address signals $\overline{A}_0$, $A_0$, $\overline{A}_1$, . . ., $\overline{A}_5$, $A_5$ so as to select one row fom the memory cells and another group 4 for decoding column address signals $\overline{A}_6$, $A_6$, $\overline{A}_7$, $A_7$, . . . , $\overline{A}_{11}$, $A_{11}$ so as to select one column from the memory cells through gates 5. In addition, the memory includes a group 6 of row address buffers which convert the row address signals $A_0$, $A_1$, . . . , $A_5$ from a TTL level to an MOS level and produce the converted signals $A_0$, $A_1$, . . . , $A_5$ and their inverted signals $\overline{A}_0$, $\overline{A}_1$, . . . $\overline{A}_5$, and another group 7 of column address buffers which convert the column address signals $A_6$, $A_7$, . . . , $A_{11}$ from a TTL level to a MOS level and produce the converted signals $A_6$, $A_7$, . . . , $A_{11}$ and their inverted signals $\overline{A}_6$, $\overline{A}_7$, . . . , $\overline{A}_{11}$. Furthermore, the memory includes a clock generator 8 which changes a chip-enable signal, i.e., a clock signal $\overline{CE}$, from a TTL level to a MOS level and produces the converted signal CE for enabling the selection of the memory cells and its inverted signal PE for precharging the bit lines and data bit lines DB and $\overline{DB}$. Furthermore, the memory includes a sense amplifier and a data output buffer 9 connected to the data bit line DB and $\overline{DB}$.

Figure 2:
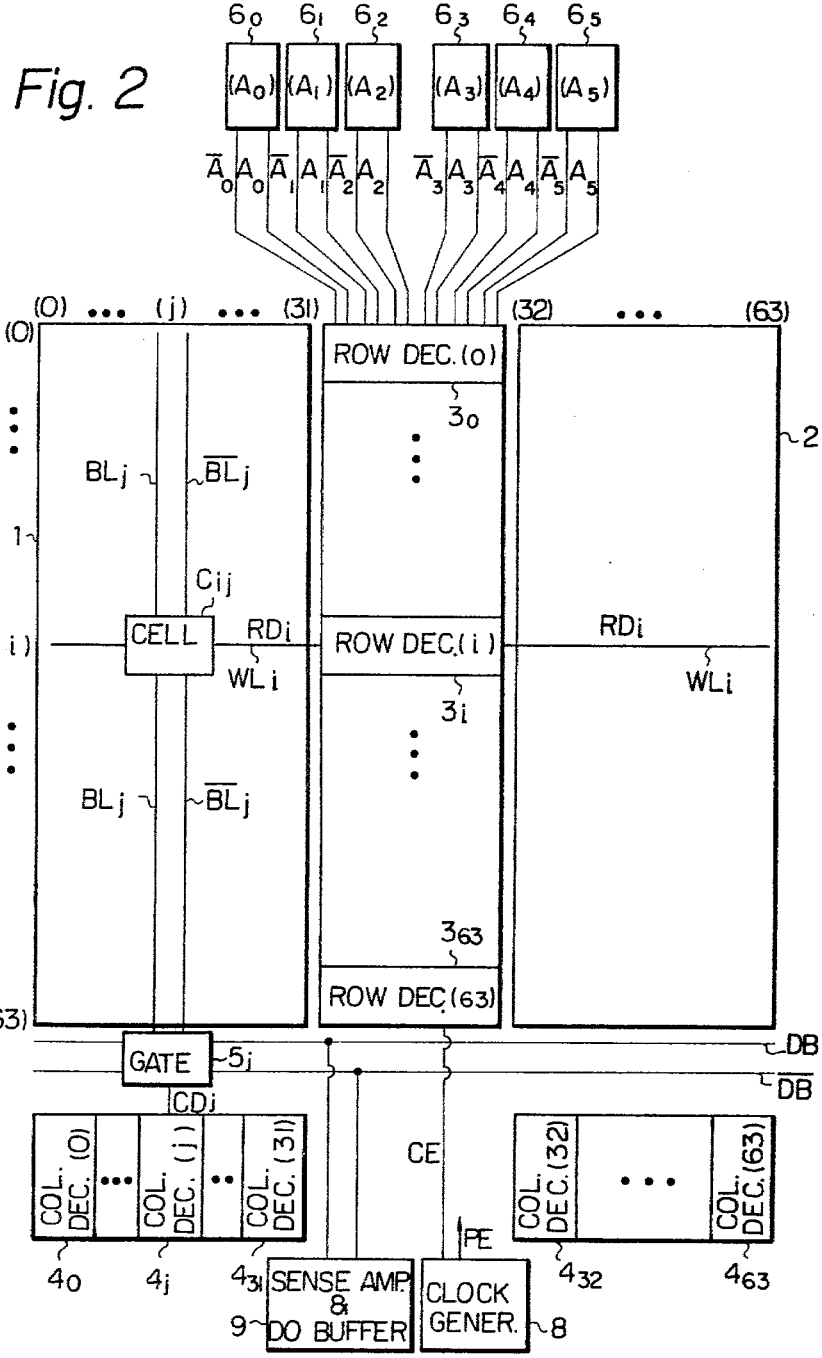
FIG. 2 is a detailed layout diagram illustrating the memory of FIG. 1.

FIG. 2 is a detailed layout diagram of the memory of FIG. 1. In FIG. 2, when a memoory cell $C_{ij}$ at the i-th row and the j-th column is required to be selected, the potential of the word line $WL_i$ is changed from low to high by the row decoder 3i, which produces a signal $RD_i$, and the bit lines $BL_j$ and $\overline{BL}_j$ are connected to the data lines DB and $\overline{DB}$, respectively, by the column decoder $4_j$ through the gate $5_j$. As shown in FIG. 2, the pitch of the row decoders $3_0$, $3_1$, . . . , $3_{63}$ is the same as that of the memory cells in the column direction, while the pitch of the column decoders $4_0$, $4_1$, . . . , $4_{53}$ is the same as that of the memory cells in the row direction. Therefore, it is necessary to reduce the area of the decoder, as well as the area of the memory cell, in order to promote high-density integration of the memory.

Figure 3:
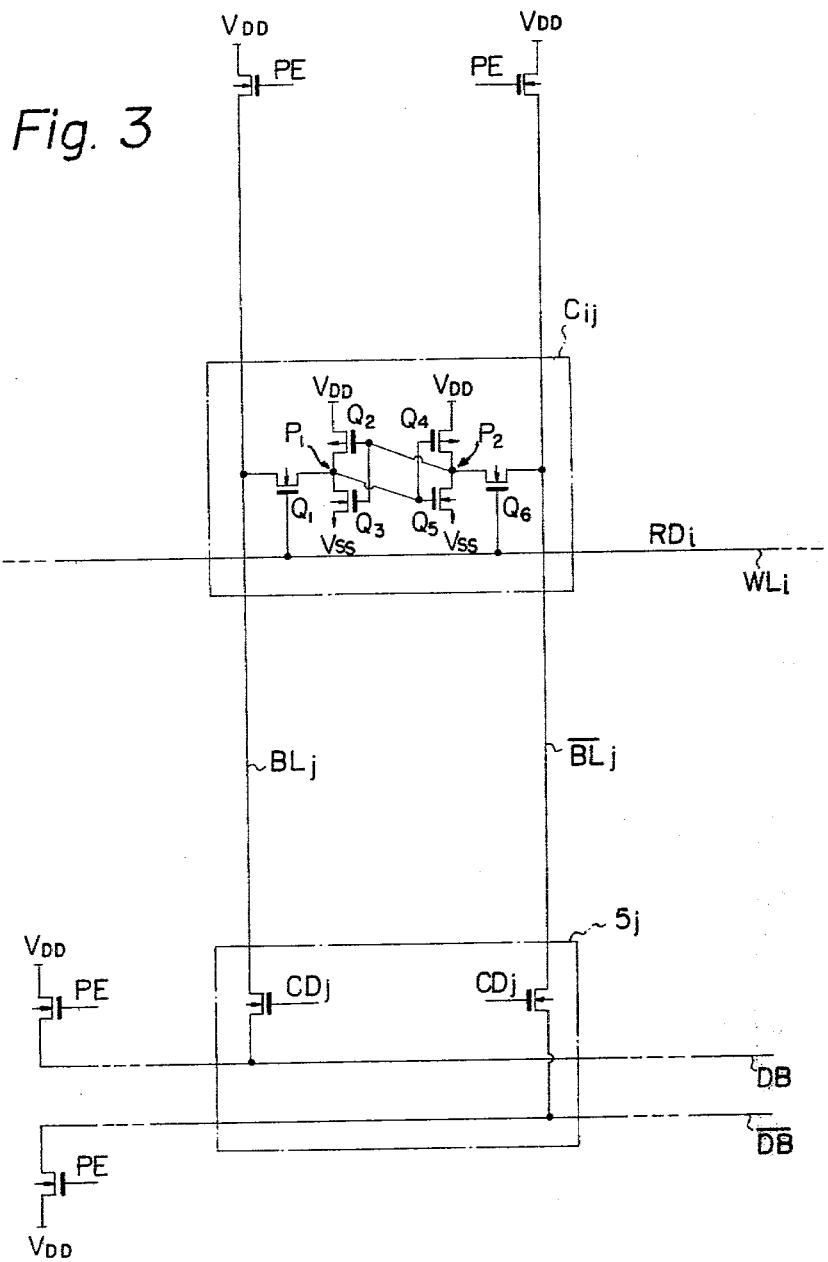
FIG. 3 is a circuit diagram illustrating a memory cell in the memory of FIG. 2.

FIG. 3 is a circuit diagram illustrating the memory cell in the memory of FIG. 2. Generally, a p-channel MOS transistor is conductive when the potential of its gate is low and equals $V_{ss}$, while a n-channel MOS transistor is conductive when the potential of its gate is high and equals $V_{DD}$. In FIG. 3, for example, the logic "1" state of the memory cell $C_{ij}$ corresponds to the state wherein the potentials at $P_1$ and $P_2$ are low and high, respectively, i.e., that the MOS transistors $Q_3$ and $Q_4$ are conductive and the MOS transistors $Q_2$ and $Q_5$ are non-conductive. Similarly, the logic "0" state of the memory cell $C_{ij}$ corresponds to the state wherein the potential at $P_1$ and $P_2$ are high and low, respectively, i.e.,, that the MOS transistors $Q_2$ and $Q_5$ are conductive and the MOS transistors $Q_3$ and $Q_4$ are non-conductive. The access operation of the memory cell $C_{ij}$ is carried out by the signals $RD_i$ and $CD_j$ whose potentials are high. As a result, the n-channel MOS transistors $Q_1$ and $Q_6$ are conductive, so that the signals appearing in the bit lines $BL_j$ and $\overline{BL}_j$, whose potential are the same as those of the data bit lines DB and $\overline{DB}$, respectively, may be written into the cell, and the signals in the data bit lines DB and $\overline{DB}$ may be read out by the sense amplifier and data output buffer 9. The abovementioned signals $RD_i$ and $CD_j$ used for this access operation are generated from the row decoder $3_i$ and the column decoder $4_j$, respectively.

Figure 4:
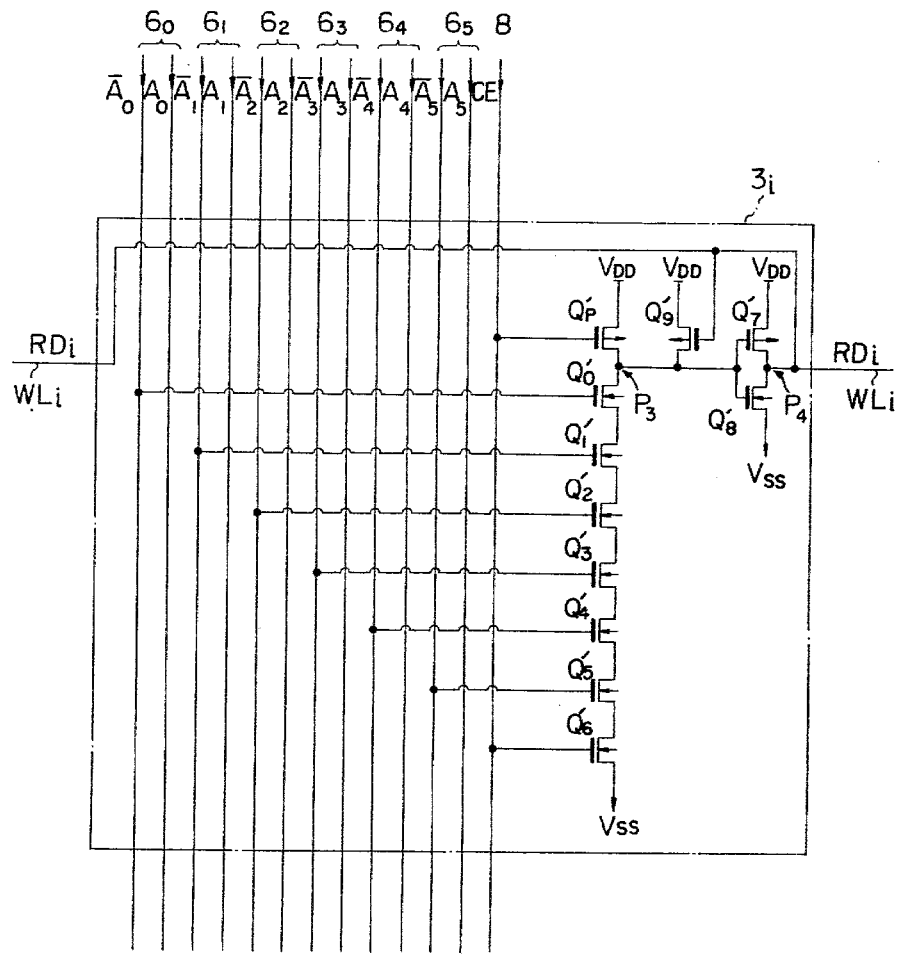
FIG. 4 is a circuit diagramm illustrating a row decoder of the prior art, used in a synchronous CMOS memory.

FIG. 4 is a circuit diagram illustrating a row decoder of the prior art used in a synchronous CMOS memory. The decoder 3i comprises a p-channel MOS transistor $Q_p'$ whose gate receives the clock signal CE, n-channel MOS transistors $Q_0'$ through $Q_5'$ whose gates receive one of the signals $\overline{A}_0$ and $A_0$, one of the signals $\overline{A}_1$ and $A_1$, . . . , and one of the signals $\overline{A}_5$ and $A_5$, respectively, and a n-channel MOS transistor $Q_6'$ whose gate receives the clock signal CE. In the case of FIG. 4, for example, the gates of the n-channel MOS transistors $Q_0'$ through $Q_5'$ receive $\overline{A}_0$, $\overline{A}_1$, $\overline{A}_2$, $\overline{A}_3$, $\overline{A}_4$ and $\overline{A}_5$, respectively. Further, the decoder 3, comprises a p-channel transistor $Q_7'$ and an n-channel MOS transistor $Q_8'$ which forms an inverter. When the word line $WL_i$ is required to be selected, the potentials of the clock signal CE and all the address signals $\overline{A}_0$, $\overline{A}_1$, . . . , $\overline{A}_5$ are high. As a result, the p-channel MOS transistor $Q_p'$ is non-conductive and all the n-channel MOS transistors $Q_0'$ through $Q_5'$ are conductive, so that the potential at $P_3$ becomes low. Therefore, the potential of the signal $RD_i$ at $P_4$ becomes high, which means that the word line $WL_i$ is selected. On the other hand, in a stand-by state wherein the potential level of the clock-signal CE is low, the MOS transistors $Q_p'$ and $Q_6'$ are conductive and non-conductive, respectively, so that the potential at $P_3$ and $P_4$ are high and low, respectively. As a result, the potential of the signal $RD_i$ in the word line $WL_i$ remains low, which means the word line $WL_i$ remains in a non-selected state. In this stand-by state, all the other word lines remain in a non-selected state so that all the memory cells of the memory are disabled no matter what the address signals $A_0$ through $A_5$ may be. Furthermore, the decoder $3_i$ comprises a p-channel MOS transistor $Q_9'$ for stabilizing the operation of the memory. For example, even if the potential at $P_3$ becomes a little low due to the leakage of $Q_0'$ through $Q_5'$ in the non-selected state, the potential at $P_3$ is forced to be high, since the p-channel MOS transistor $Q_9'$ whose gate receives the signal $RD_i$, whose potential is low, is conductive. Thus, a stable non-selected state can be established by the MOS transistor $Q_9'$. However, a memory chip includes a large number of row decoders, for example, 64 row decoders (704 MOS transistors) in the case of a 4 Kbit memory, so that the area the row decoders occupy in the chip is very large.

Figure 5:
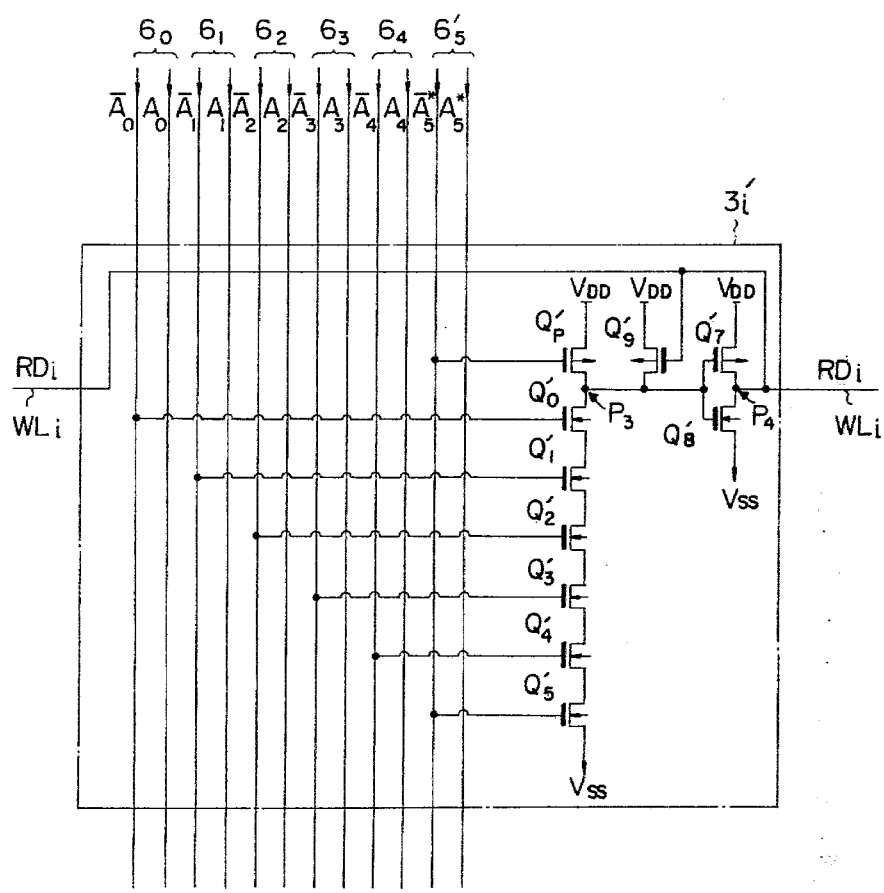
FIG. 5 is a circuit diagram illustrating an embodiment of the row decoder of the present invention, used in a synchronous CMOS memory.

FIG. 5 is a circuit diagram illustrating an embodiment of the row decoder of the present invention, used in a synchronous CMOS memory. The elements illustrated in FIG. 5 which are identical with those of FIG. 4 are denoted by the same reference numerals. In FIG. 5, clock-including address signals $\overline{A}_5^*$ and $A_5^*$ are defined as follows.

$$\overline{A}_5^* = \overline{A}_5 \cap CE \quad (1)$$

$$A_5^* = A_5 \cap CE \quad (2)$$

Therefore, when the potential of the clock signal CE is low, each potential of the clock-including address signals $\overline{A}_5^*$ and $A_5^*$ is low no matter what the signals $\overline{A}_5$ and $A_5$ may be. Conversely, when the potential of the clock signal CE is high, the potentials of the clock-including address signals $\overline{A}_5^*$ and $A_5^*$ are the same as those of the address signals $\overline{A}_5$ and $A_5$, respectively. The two gates of the p-channel MOS transistor $Q_p 40$ and the n-channel MOS transistor $Q_5'$ receive the same signal, which is one of $\overline{A}_5^*$ and $A_5^*$ (in the case of FIG. 5, $\overline{A}_5^*$). When the potential of the clock signal CE is low, the potential of clock-including address signals $\overline{A}_5^*$ and $A_5^*$ are also low so that the potential at $P_3$ and $P_4$ are high and low, respectively. As a result, the potential of the signal $RD_i$ in the word line $WL_i$ is low. Similarly, all potentials of the signals $RD_i$ in the word line $WL_i$ (i equals 0 through 63) are low, which means that all the memory cells in the memory are disabled, no matter what the address signals $A_0$ through $A_5$ may be. Thus, when the potential of the clock signal CE is low, the same stand-by state as mentioned in FIG. 4 can be obtained.

In FIG. 5, when the potential of the clock signal CE is high, the potential of one of the clock-including address signals $\overline{A}_5^*$ and $A_5^*$ is low. As a result, one half of the p-channel MOS transistors $Q_p'$ included in the decoder $3_i'$ (i equals 0 through 63) are conductive, since the clock-including address signal $\overline{A}_5^*$ is supplied to one half of all the decoders, for example, the decoders $3_i'$ (i equals 0 through 31), while the clock-including address signal $A_5^*$ is supplied to the others, for example, the decoders $3_i'$ (i equals 32 through 63). Therefore, even if the potential of the clock signal CE is high, the memory cells belonging to the i-th row (i equals 32 through 63) are disabled, no matter what the address signals $A_0$ through $A_4$ may be. Thus, even during memory access operation wherein the potential of one of the clock-including address signals $\overline{A}_5^*$ and $A_5^*$ is high, one half of the memory cells can be stably disabled. Furthermore, the number of elements in the decoder $3_i'$ of FIG. 5 is smaller than that of elements in the decoder $3_i$ of FIG. 4 by one element. This element corresponds to the MOS transistor $Q_6'$ of FIG. 4. Therefore, the area the decoders $3_i'$ (i equals 0 through 63) occupy in the memory chip is reduced relative to the area the decoders $3_i$ (i equals 0 through 63) occupy in the chip.

Figure 6A:
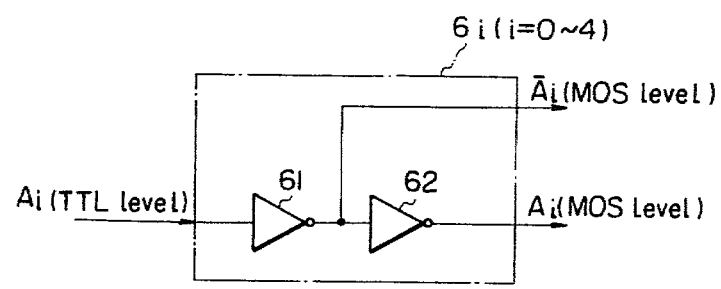
FIG. 6a is a logic circuit diagram illustrating an address buffer for generating the address signals $\overline{A}_i$ and $A_i$ (i equals 0 through 4) of FIG. 5.

FIG. 6a is a logic circuit diagram illustrating an address buffer $6_i$ (i equals 0 through 4) for generating the address signals $\overline{A}_i$ and $A_i$ of FIG. 5. In FIG. 6a, the address signal $A_i$, which is at a TTL level, is inverted by an inverter 61 so that the inverter 61 produces the address signal $\overline{A}_i$, which is at an MOS level. Further, the output signal of the inverter 61 is inverted by an inverter 62 which produces the address signal $A_i$, which is at an MOS level. Thus, two address signals $\overline{A}_i$ and $A_i$ at an MOS level are obtained by the two inverters 61 and 62.

Figure 6B:
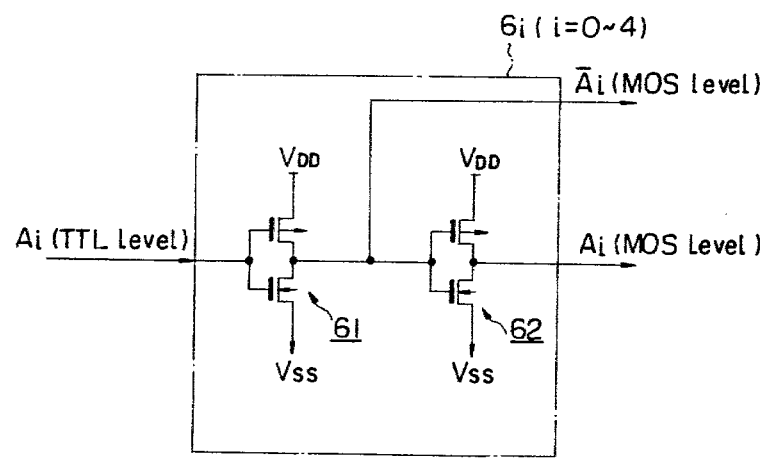

FIG. 6b is a circuit diagram illustrating the address buffer $6_i$ of FIG. 6a. As shown in FIG. 6b, each of the inverters 61 and 62 is composed of a p-channel MOS transistor and a n-channel MOS transistor connected in series. Therefore, the address buffer $6_i$ can be manufactured easily by using CMOS technology.

Figure 7A:
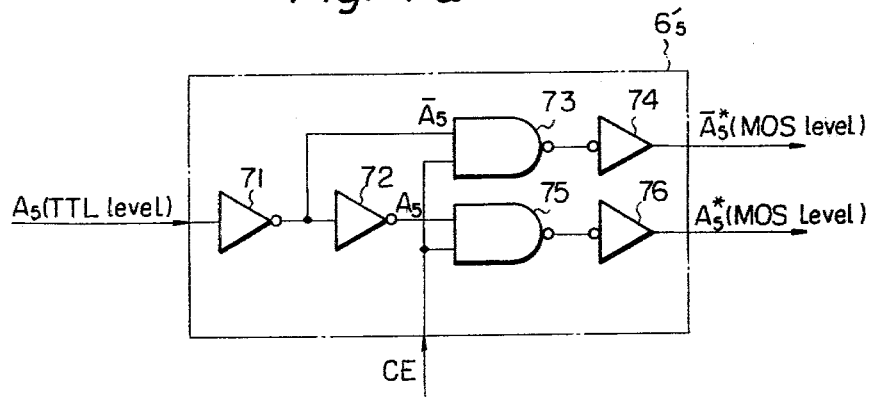
FIG. 7a is a logic circuit diagram illustrating an address buffer for generating the clock-including address signals $\overline{A}_5^*$ and $A_5^*$ of FIG. 5.

FIG. 7a is a logic circuit diagram illustrating an address buffer $6_5'$ for generating the clock-including address signals $\overline{A}_5^*$ and $A_5^*$ of FIG. 5. In FIG. 7a, the address signal $A_5$, which is at a TTL level, is inverted by an inverter 71 whose output signal is also inverted by an inverter 72. The signal $\overline{A}_5$ (MOS level) at the output of the inverter 71 is applied to one input of NAND gate 73, to whose other gate is applied the clock signal CE. In addition, the output signal of NAND gate 73 is inverted by an inverter 74. Therefore, the signal $\overline{A}_5^*$, defined by the afore-mentioned formula (1), is obtained at the output of the inverter 74. Similarly, the signal $A_5$ (MOS level) at the output of the inverter 72 is applied to one input of NAND gate 75, to whose other gate is applied the clock signal CE. In addition, the output signal of NAND gate 75 is inverted by an inverter 76. Therefore, the signal $A_5^*$, defined by the afore-mentioned formula (2), is obtained at the output of the inverter 76.

Figure 7B:
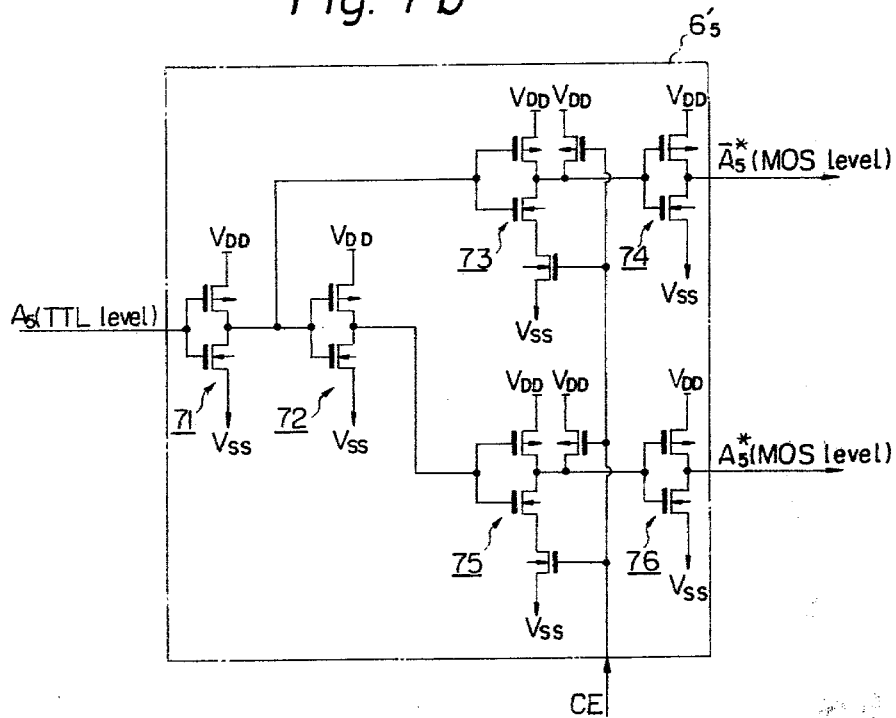
FIG. 7b is a circuit diagram illustrating the address buffer of FIG. 7b.

FIG. 7b is a circuit diagram illustrating the address buffer $6_5'$ of FIG. 7a. As shown in FIG. 7b, each of the inverters 71, 72, 74 and 76 is composed of a p-channel MOS transistor and a n-channel MOS transistor connected in series, and; each of NAND gates 73 and 75 is composed of two p-channel MOS transistors connected in parallel and two n-channel MOS transistors connected in series, wherein the p-channel MOS transistors and the n-channel transistors are also connected in series. Therefore, the address buffer $6_5'$ can be manufactured easily by using CMOS technology.

The operation of the decoder of FIG. 5 for decoding the address signals and the clock-including address signals will now be explained in detail. FIGS. 8a through 8f are timing diagrams showing the signals appearing in the address buffers of FIGS. 6a and 7a, and the decoder of FIG. 5. As shown in FIG. 8a, one access cycle is composed of an active time for accessing a memory cell and a stand-by time for precharging the memory. The clock signal $\overline{CE}$ (TTL level), as shown in FIG. 8a, is converted to the clock signal CE (MOS level), as shown in FIG. 8c, by the clock generator 8 (FIG. 2). In addition, the address signals $A_i$ (i equals 0 through 4, TTL level), as shown in FIG. 8b, are converted to the address signals $A_i$ (MOS level) and their inverted signals $\overline{A}_i$, as shown in FIG. 8d, by the address buffers $6_i$ (FIG. 6a). Furthermore, the clock-including address signals $\overline{A}_5^*$ (MOS level), as shown in FIG. 8e, are obtained by the address buffers $6_5'$ (FIG. 7a). In this case, the potential of these clock-including address signals $\overline{A}_5^*$ and $\overline{A}_5$ are low during a stand-by time, so that the potential of the signal $RD_i$, as shown in FIG. 8f, is low. As a result, all the memory cells connected to the word line $WL_i$, to which are applied the signal $RD_i$, are disabled. On the other hand, during an active time wherein the potential of the clock signal CE is high, only one of the potentials of the signals $RD_i$ (i equals 0 through 63) is high, as shown in FIG. 8f, so that only one word line is selected. Furthermore, the potentials of one half of the remainder of the word lines which are non-selected are stably low, since the decoders therefor receive one of the signals $\overline{A}_5{}^*$ and $\overline{A}_5$ whose potential is low. As a result, during an active time, one half of the memory cells in the memory are stably disabled, which promotes the stable operation of the memory.

The above-described embodiment relates to the decoder applicable for a 4,096 bit CMOS memory, but it should be noted that this invention is applicable to other CMOS memories whose capacities are, for example, 1,024, 16,384 or 65,536 bits, or the like. In addition, in the above-described embodiment, the address signal $\overline{A}_5$ ($A_5$) and the clock signal CE are logically multiplied to form the clock-including address signal $\overline{A}_5{}^*$ ($A_5{}^*$), but it should be noted that an arbitrary address signal $\overline{A}_i$ ($A_i$) and the clock signal CE can be logically multiplied to form a clock-including address signal $\overline{A}_i{}^*$ ($A_i{}^*$).

As explained hereinbefore, the decoder according to the present invention has the following advantages as compared with those of the prior art.

(1) The total area the decoders occupy in a chip is reduced, because the number of elements, such as MOS transistors, included in each of the decoders of this invention is smaller than that included in the decoder of the prior art by one. Therefore, a high-density integration of the memory can be attained.

(2) The selection of the memory cells by the decoders can be stably carried out, because the potentials of one half of the non-selected word lines are forced to be low, even if the potential of the clock signal CE is high.

What is claimed is:

1. A decoder, for decoding a plurality of address signals and a clock signal, in a synchronous CMOS memory, comprising:
   a first MOS transistor of a first conductivity-type, having a gate to which a clock-including address signal is applied, said clock-including address signal being defined as a logical product of a selected one of said plurality of address signals and said clock signal, and;
   a plurality of MOS transistors of a second conductivity-type, opposite to said first conductivity type, connected in series, each of said plurality of MOS transistors having a gate to which one of the plurality of address signals is applied, wherein a selected one of said plurality of MOS transistors has a gate for receiving said clock-including address signal, whereby a terminal, connecting said first MOS transistor and said plurality of MOS transistors in series, serves as an intermediate output terminal of said decoder.

2. A decoder as set forth in claim 1, further comprising an inverter, having an input and an output, comprising a second MOS transistor of said first conductivity-type and a third MOS transistor of said second conductivity-type connected in series, wherein said inverter is connected to said intermediate output terminal, whereby the output of said inverter serves as an output of said decoder.

3. A decoder as set forth in claim 2, further comprising a fourth MOS transistor of said first conductivity-type having a source and a gate connected to the input and the output of said inverter, respectively.

4. A decoder as set forth in claims 1, 2, or 3, wherein said first, second and fourth MOS transistors are p-channel MOS transistors, while said plurality of MOS transistors and said third MOS transistor are n-channel MOS transistors.

5. A decoder as set forth in claim 1, 2, or 3, wherein said first, second and fourth MOS transistors are n-channel MOS transistors, while said plurality of MOS transistors and said third MOS transistor are p-channel MOS transistors.

6. A decoder, for decoding N address signals, where N is a positive integer, and a clock signal, in a synchronous CMOS memory, wherein the decoder is operatively connected to means for providing a clock including address signal, said clock including address signal being defined as the logical product of a selected one of said N address signals and said clock signal, the decoder comprising:
   a first MOS transistor of a first conductivity type, having a gate operatively connected to the means for providing the clock including address signal; and
   N MOS transistors of a second conductivity-type, opposite to said first conductivity type, said N MOS transistors connected in series, a selected one of said N MOS transistors having a gate operatively connected to the means for providing the clock including address signal, each of said remaining N MOS transistors having a gate for receiving one of the other N address signals, whereby a terminal connecting said first MOS transistor and said N MOS transistors connected in series is an intermediate output terminal of the decoder.

7. A decoder as set forth in claim 6, further comprising, a second MOS transistor of said first conductivity type, having a gate operatively connected to said intermediate output terminal and having a source; a third MOS transistor of said second conductivity type, having a gate operatively connected to said intermediate output terminal and having a drain operatively connected to the source of said second MOS transistor at the output of said decoder.

8. A decoder as set forth in claim 7, further comprising a fourth MOS transistor of said first conductivity type, having a source operatively connected at said intermediate output terminal and having a gate operatively connected to the output of said decoder.

9. A decoder as set forth in claims 6, 7, or 8 wherein said first, second and fourth MOS transistors are p-channel MOS transistors, while said N MOS transistors and said third MOS transistor are n-channel MOS transistors.

10. A decoder as set forth in claims 6, 7 or 8 wherein said first, second and fourth MOS transistors are n-channel MOS transistors, while said N MOS transistors and said third MOS transistor are p-channel MOS transistors.

* * * * *

UNITED STATES PATENT AND TRADEMARK OFFICE
CERTIFICATE OF CORRECTION

PATENT NO. : 4,247,921

DATED : January 27, 1981

INVENTOR(S) : HIDEO ITOH ET AL.

It is certified that error appears in the above—identified patent and that said Letters Patent is hereby corrected as shown below:

Col. 1, line 22, after "lines" insert --,--;
       line 26, after "lines" insert --,--;
       line 60, "eiminate" should be --eliminate--.
Col. 4, line 8, "potential" should be --potentials--;
       line 9, "i.e.,," should be --i.e.,--;
       line 16, "potential" should be --potentials--;
       line 26, "3i" should be --$3_i$--;
       line 35, after "3" delete ",";
       line 48, "potential" should be --potentials--.
Col. 5, line 20, "$Q_p 40$" should be --$Q_p'$--;
       line 25, "pötential" should be --potentials--;
       line 39, "decoder" should be --decoders--;
       line 49, after "during" insert --a--.
Col. 7, line 39, ", and;" should be --; and--.

Signed and Sealed this

Twenty-third Day of June 1981

[SEAL]

Attest:

RENE D. TEGTMEYER

Attesting Officer      Acting Commissioner of Patents and Trademarks